United States Patent
Chen et al.

(10) Patent No.: US 11,443,980 B2
(45) Date of Patent: Sep. 13, 2022

(54) METHOD OF FABRICATING SEMICONDUCTOR DEVICE WITH METAL PAD EXTENDING INTO TOP METAL LAYER

(71) Applicant: Taiwan Semiconductor Manufacturing Co., Ltd., Hsinchu (TW)

(72) Inventors: Chia-Chung Chen, Keelung (TW); Chi-Feng Huang, Hsinchu County (TW); Victor Chiang Liang, Hsinchu (TW); Chung-Hao Chu, Hsinchu (TW); Ching-Yu Yang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 11 days.

(21) Appl. No.: 16/883,958

(22) Filed: May 26, 2020

(65) Prior Publication Data
US 2021/0098286 A1   Apr. 1, 2021

Related U.S. Application Data

(60) Provisional application No. 62/906,744, filed on Sep. 27, 2019.

(51) Int. Cl.
*H01L 21/768* (2006.01)
*H01L 21/324* (2006.01)
(Continued)

(52) U.S. Cl.
CPC ...... *H01L 21/76814* (2013.01); *H01L 21/324* (2013.01); *H01L 21/76805* (2013.01);
(Continued)

(58) Field of Classification Search
CPC ... H01L 21/308–3088; H01L 21/31144; H01L 21/32; H01L 21/32139; H01L 21/467; H01L 21/475; H01L 21/469–47576; H01L 21/02013; H01L 21/02024; H01L 21/2633; H01L 21/304–3046; H01L 21/32131–32132; H01L 21/463; H01L 21/4842;
(Continued)

(56) References Cited

U.S. PATENT DOCUMENTS 8,735,993 B2   5/2014   Lo et al.
8,772,109 B2   7/2014   Colinge
(Continued)

*Primary Examiner* — Sonya McCall-Shepard
(74) *Attorney, Agent, or Firm* — JCIPRNET

(57) ABSTRACT

A method of fabricating a semiconductor device includes at least the following steps is provided. A first metal layer is formed on a substrate. A first dielectric layer is formed on the substrate. The first dielectric layer is patterned, thereby forming a first opening exposing the first metal layer. A second metal layer is formed on the first dielectric layer and filling into the first opening. The second metal layer is patterned, thereby forming a metal pad. A second dielectric layer is formed on the first dielectric layer and the metal pad. The second dielectric layer is patterned, thereby forming a second opening exposing the metal pad. A first annealing process is performed in an atmosphere of a gas including 50 vol % to 100 vol % of hydrogen.

20 Claims, 8 Drawing Sheets

(51) Int. Cl.
*H01L 29/08* (2006.01)
*H01L 29/165* (2006.01)
*H01L 29/45* (2006.01)
*H01L 29/78* (2006.01)
*H01L 29/10* (2006.01)
*H01L 29/66* (2006.01)

(52) U.S. Cl.
CPC .. *H01L 21/76843* (2013.01); *H01L 21/76895* (2013.01); *H01L 29/0847* (2013.01); *H01L 29/165* (2013.01); *H01L 29/45* (2013.01); *H01L 29/7833* (2013.01); *H01L 29/7848* (2013.01)

(58) Field of Classification Search
CPC ......... H01L 21/3063–30635; H01L 21/32125; H01L 21/465; H01L 21/3065–30655; H01L 21/31116; H01L 21/31122; H01L 21/31138; H01L 21/67069; H01L 21/32136–32137; H01L 21/02071; H01L 21/768–76898; H01L 23/481; H01L 23/522; H01L 23/5226; H01L 23/528; H01L 23/532–53295; H01L 21/3205–32138; H01L 21/823475; H01L 2221/10–1089; H01L 2224/038; H01L 2224/80014; H01L 29/41725–41791; H01L 29/7839; H01L 29/806; H01L 29/665–66507; H01L 29/7845; H01L 21/823418; H01L 21/324; H01L 21/02362; H01L 21/02274; H01L 21/76843; H01L 21/76877; H01L 21/76802; H01L 21/76801; H01L 21/164; H01L 21/477; H01L 21/76828; H01L 21/76864; H01L 21/74; H01L 23/535; H01L 2224/05009; H01L 2224/0525; H01L 2224/05087; H01L 2224/0509; H01L 2224/0557; H01L 2224/08146; H01L 2224/0603; H01L 2224/06102; H01L 2224/0801; H01L 2224/08052–0807; H01L 2224/081–08268; H01L 2224/0903; H01L 2224/09051–09055; H01L 2224/091–09183; C23F 1/00–46; C25F 3/02–14

See application file for complete search history.

(56) References Cited

U.S. PATENT DOCUMENTS

| | | | |
|---|---|---|---|
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 8,927,362 | B2 | 1/2015 | Ching et al. |
| 8,963,258 | B2 | 2/2015 | Yu et al. |
| 8,987,028 | B2 | 3/2015 | Lochtefeld et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,236,300 | B2 | 1/2016 | Liaw |
| 9,508,593 | B1 * | 11/2016 | Rozbicki ........... H01L 21/76843 |
| 9,515,196 | B2 | 12/2016 | Fitzgerald |
| 9,520,482 | B1 | 12/2016 | Chang et al. |
| 9,548,303 | B2 | 1/2017 | Lee et al. |
| 9,576,814 | B2 | 2/2017 | Wu et al. |
| 2007/0099414 | A1 * | 5/2007 | Frohberg .......... H01L 23/53238 438/618 |
| 2016/0329374 | A1 * | 11/2016 | Hara ................ H01L 27/14698 |

\* cited by examiner

METHOD OF FABRICATING SEMICONDUCTOR DEVICE WITH METAL PAD EXTENDING INTO TOP METAL LAYER

CROSS-REFERENCE TO RELATED APPLICATION

This application claims the priority benefit of U.S. provisional application Ser. No. 62/906,744, filed on Sep. 27, 2019. The entirety of the above-mentioned patent application is hereby incorporated by reference herein and made a part of this specification.

BACKGROUND

A good understanding of the matching behavior of devices available in a particular integrated circuit (IC) technology is critical in designing ICs. With the advancements in technology leading to smaller feature sizes and more stringent design constraints, products with consistent performance become more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
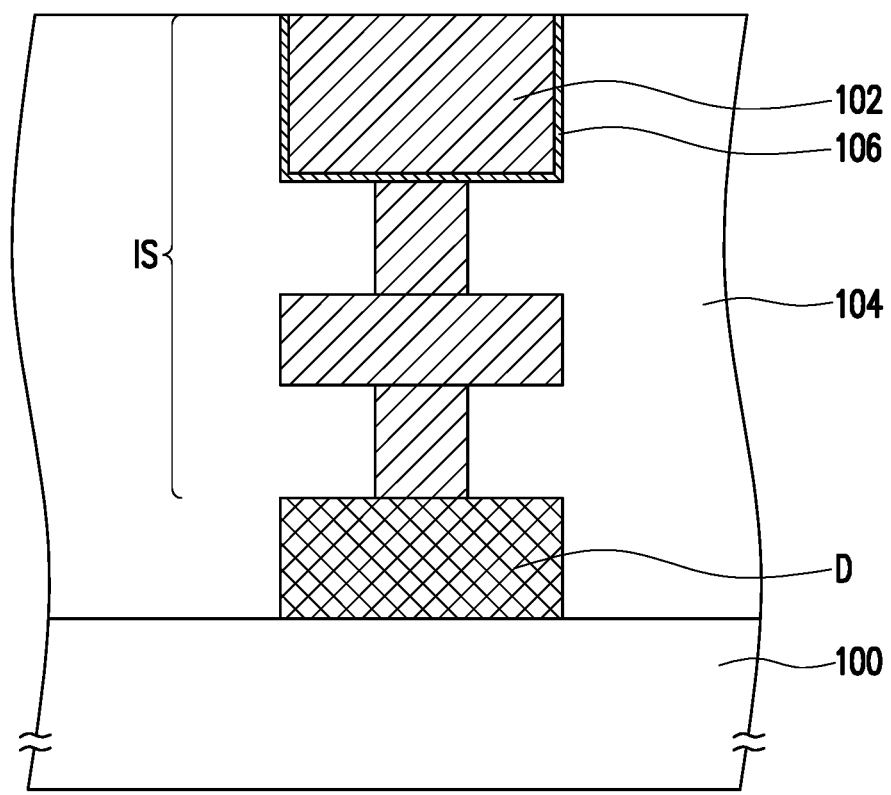
FIG. 1A to FIG. 1G are cross-sectional views illustrating various stages of a method of fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a cross-sectional view illustrating one stage of a method of fabricating a semiconductor device 10 in accordance with some embodiments of the disclosure. Referring to FIG. 1A, a substrate 100 is provided. The substrate 100 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the substrate 100 includes a crystalline silicon substrate (e.g., wafer). In some alternative embodiments, the semiconductor substrate 100 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The substrate 100 may include various doped regions depending on design requirements (e.g., p-type semiconductor substrate or n-type semiconductor substrate). The doped regions may be doped with p-type or n-type dopants. For example, the doped regions may be doped with p-type dopants, such as boron (B) or $BF_2$; n-type dopants, such as phosphorus or arsenic; and/or a combination thereof. The dopant concentration in various doped regions may be different. In addition, depending on product design requirements, a desired device D may be formed on the substrate 100. The desired device D may be an active device (e.g., a transistor or the like) or a passive device (e.g., a capacitor, an inductor, or the like). The device D may be a long gate length (e.g., Long-Lg=0.24 um) transistor, a middle gate length (e.g., Middle-Lg=0.1 um) transistor, or a short gate length (e.g., Short-Lg=0.03 um) transistor. The transistor is, for example, a planar metal-oxide-semiconductor field-effect transistor (MOSFET), a FinFET, or a nanowire FET.

As illustrated in FIG. 1A, a metal layer 102 and a dielectric layer 104 are formed on the substrate 100. The metal layer 102 may be a top metal layer of an interconnect structure IS. The material of the metal layer 102 may include copper (Cu), aluminum (Al), or tungsten (W). The metal layer 102 may be formed by, for example, electro-chemical plating process, chemical vapor deposition (CVD), plasma enhanced chemical vapor deposition (PECVD), physical vapor deposition (PVD), a combination thereof, or the like. The metal layer 102 may be electrically connected to the device D disposed on the substrate 100 by the other portion of the interconnect structure IS.

The metal layer 102 may be formed in the dielectric layer 104. In some embodiments, the material of the dielectric layer 104 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the material of the dielectric layer 104 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 104 may include one or more dielectric materials and/or one or more dielectric layers. The dielectric layer 104 may be formed to a suitable thickness by Flowable Chemical Vapor Deposition (FCVD), CVD, High Density Plasma Chemical Vapor Deposition (HDPCVD), Sub Atmospheric Chemical Vapor Deposition (SACVD), spin-on, sputtering, or other suitable methods.

In some embodiments, a barrier layer 106 is formed between the metal layer 102 and dielectric layer 104. The material of the barrier layer 106 includes titanium (Ti), titanium nitride (TiN), tantalum (Ta), tantalum nitride (TaN), or a combination thereof. The barrier layer 106 may be formed by, for example, PVD or ALD. It should be noted that the barrier layer 106 illustrated in FIG. 1A may be omitted in some alternative embodiments.

Figure 1B:
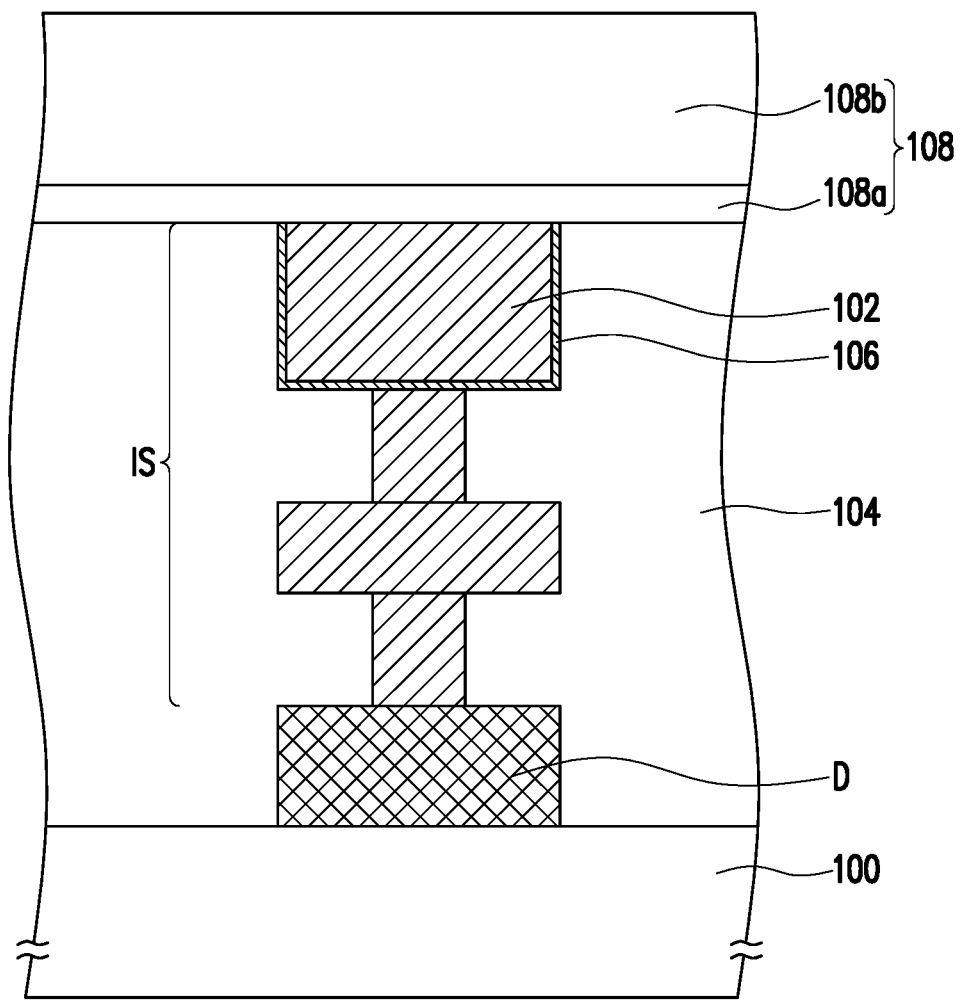

FIG. 1B is a cross-sectional view illustrating one stage of a method of fabricating a semiconductor device 10 in accordance with some embodiments of the disclosure. Referring to FIG. 1B, a dielectric layer (or referred to as a passivation layer) 108 is formed over the substrate 100. For example, the dielectric layer 108 may be formed on the dielectric layer 104 and the metal layer 102. In some alternative embodiments, the material of the dielectric layer 108 includes silicon oxide, silicon nitride, silicon oxynitride, PSG, BPSG, SOG, FSG, carbon doped silicon oxide (e.g., SiCOH), polyimide, and/or a combination thereof. In some alternative embodiments, the material of the dielectric layer 108 includes low-k dielectric materials. Examples of low-k dielectric materials include BLACK DIAMOND®, Xerogel, Aerogel, amorphous fluorinated carbon, Parylene, BCB, Flare, SILK®, HSQ or SiOF, and/or a combination thereof. It is understood that the dielectric layer 108 may include one or more dielectric materials and/or one or more dielectric layers. For example, the dielectric layer 108 includes a dielectric layer 108a and a dielectric layer 108b disposed on the dielectric layer 108a. In some embodiments, the material of the dielectric layer 108a is silicon nitride, and material of the dielectric layer 108b is silicon oxide. The dielectric layer 108 may be formed to a suitable thickness by FCVD, CVD, HDPCVD, SACVD, spin-on, sputtering, or other suitable methods.

Figure 1C:
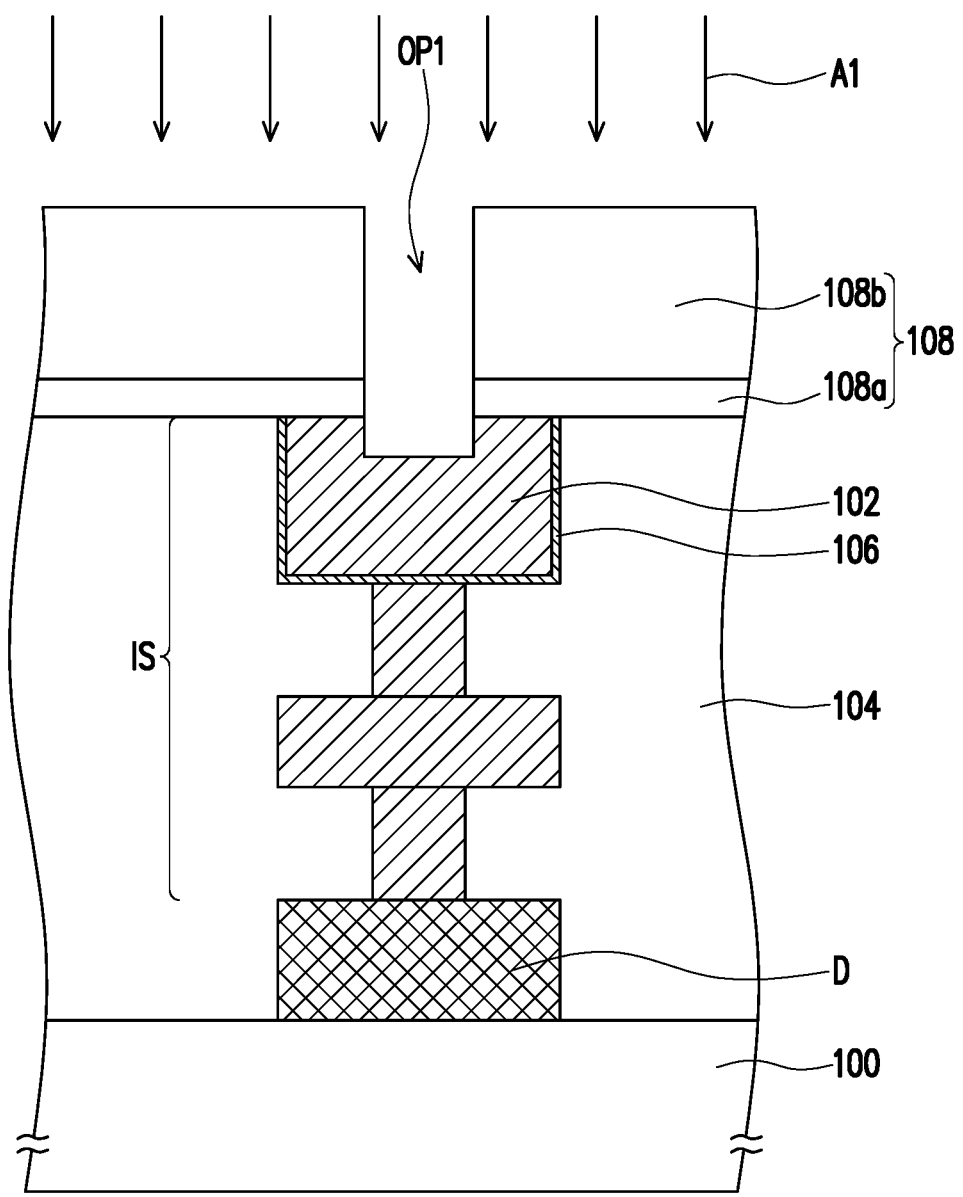

FIG. 1C is a cross-sectional view illustrating one stage of a method of fabricating a semiconductor device 10 in accordance with some embodiments of the disclosure. Referring to FIG. 1C, the dielectric layer 108 is patterned, thereby forming an opening OP1 exposing the metal layer 102. The dielectric layer 108 may be patterned by a lithography process and an etching process. The above-mentioned etching process may be a dry etching process. The method of forming opening OP1 may include performing a main etching process on the dielectric layer 108, and then performing an over-etching process after performing the main etching process. In some embodiments, the main etching process and the over-etching process are controlled by time mode. In some alternative embodiments, the main etching process is performed by using the dielectric layer 108a as an etch stop layer, and then the over-etching process is performed to remove the dielectric layer 108a and to expose the metal layer 102. In some embodiments, a portion of the metal layer 102 may be removed during the over-etching process. The radio frequency (RF) power of the over-etching process may be greater than the RF power of the main etching process and less than three times the RF power of the main etching process. When the RF power of the etching process is less, the etching speed will be lower, and the etching process can be better controlled. For example, the RF power of the over-etching process may be 2 to 3 times the RF power of the main etching process. A ratio of a thickness of the metal layer 102 removed by the over-etching process to an entire thickness of the metal layer 102 may range from 1/5 to 1/3.

An annealing process (or referred to as an alloy process) A1 may be performed after forming the opening OP1. Thereby, the defects generated in the etching process for forming opening OP1 may be repaired by the annealing process A1. In some embodiments, the annealing process A1 may be performed in an atmosphere of a gas including a $H_3PO_4/HNO_3$ mixture. In some embodiments, the annealing process A1 may be performed at a temperature between 400° C. and 800° C. for 30 minutes to 4 hours.

Figure 1D:
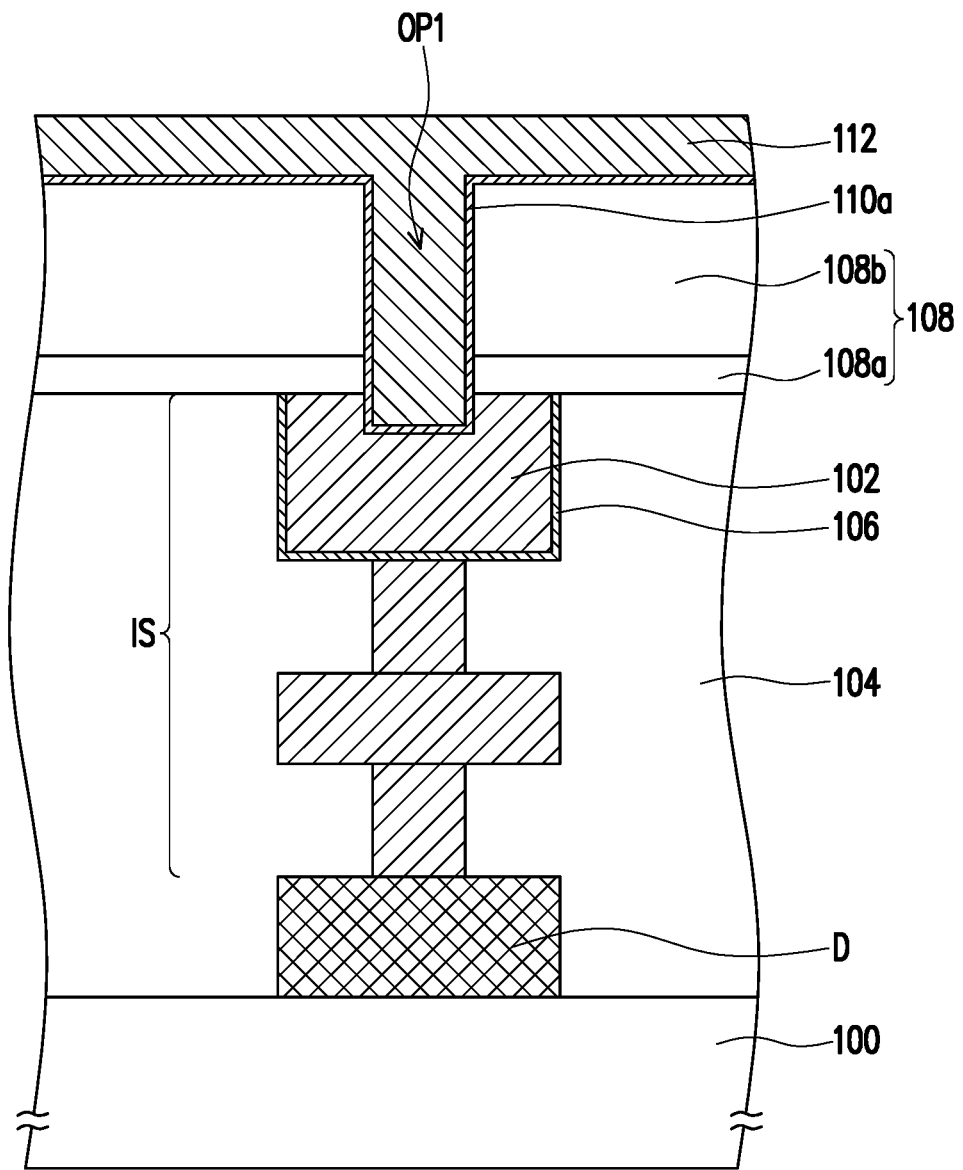

FIG. 1D is a cross-sectional view illustrating one stage of a method of fabricating a semiconductor device 10 in accordance with some embodiments of the disclosure. Referring to FIG. 1D, a barrier layer 110 may be formed on the dielectric layer 108 and on the surface of the opening OP1. In some embodiments, the material of the barrier layer 110 includes Ti, TiN, Ta, TaN, or a combination thereof, and formed by, for example, PVD or ALD. It should be noted that the barrier layer 110 illustrated in FIG. 1D may be omitted in some alternative embodiments.

As illustrated in FIG. 1D, a metal layer 112 is formed on the dielectric layer 108 and filling into the opening OP1. The metal layer 112 may be formed on the barrier layer 110. In some embodiments, the material of the metal layer 112 includes Al or W, and is formed by electro-chemical plating process, CVD, PECVD, PVD, a combination thereof, or the like.

Figure 1E:
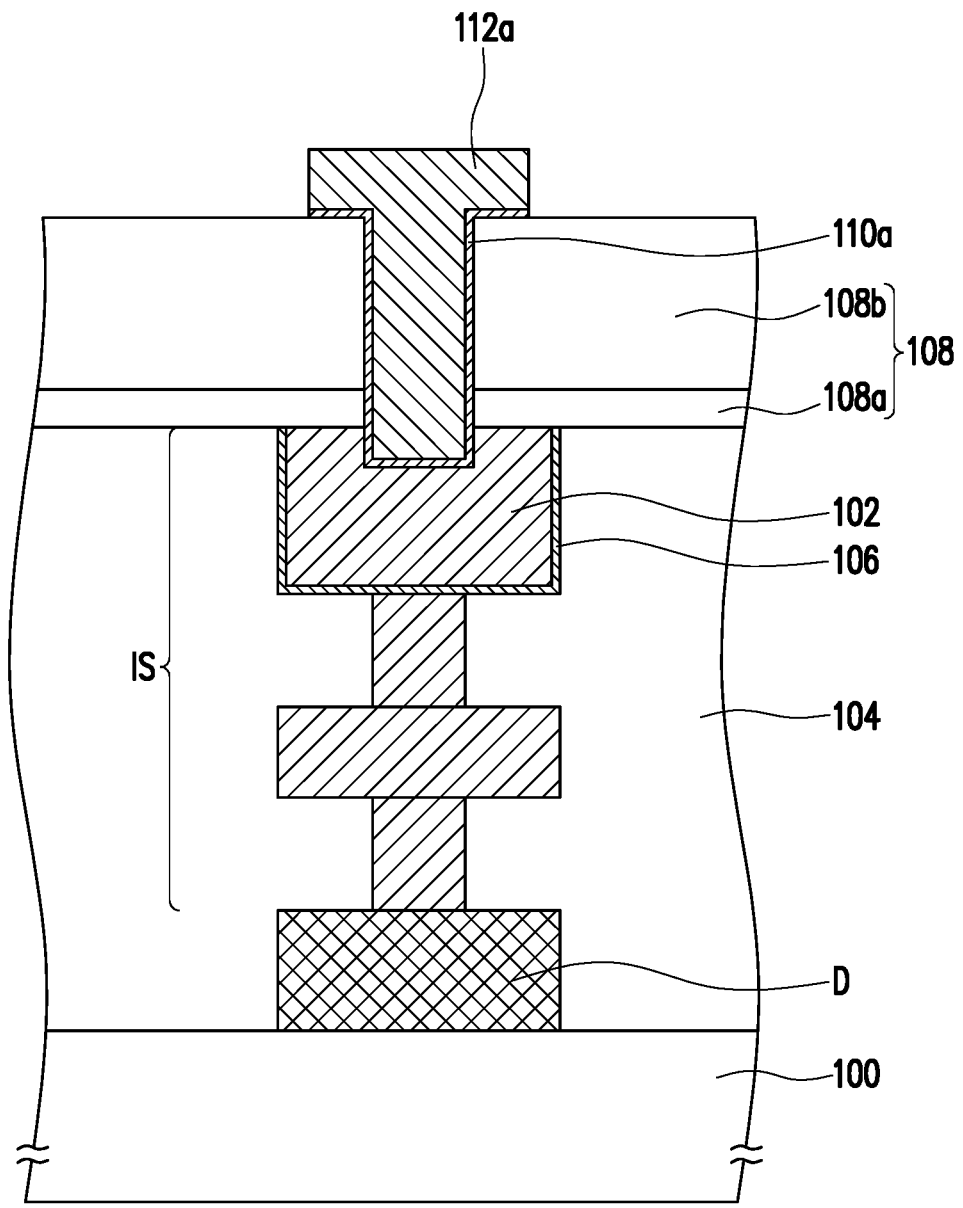

FIG. 1E is a cross-sectional view illustrating one stage of a method of fabricating a semiconductor device 10 in accordance with some embodiments of the disclosure. Referring to FIG. 1E, the metal layer 112 is patterned, thereby forming a metal pad 112a. The barrier layer 110 may be patterned, thereby forming a barrier layer 110a. In some embodiments, the metal layer 112 and the barrier layer 110 are patterned by a lithography process and an etching process. The above-mentioned etching process may be a dry etching process.

Figure 1F:
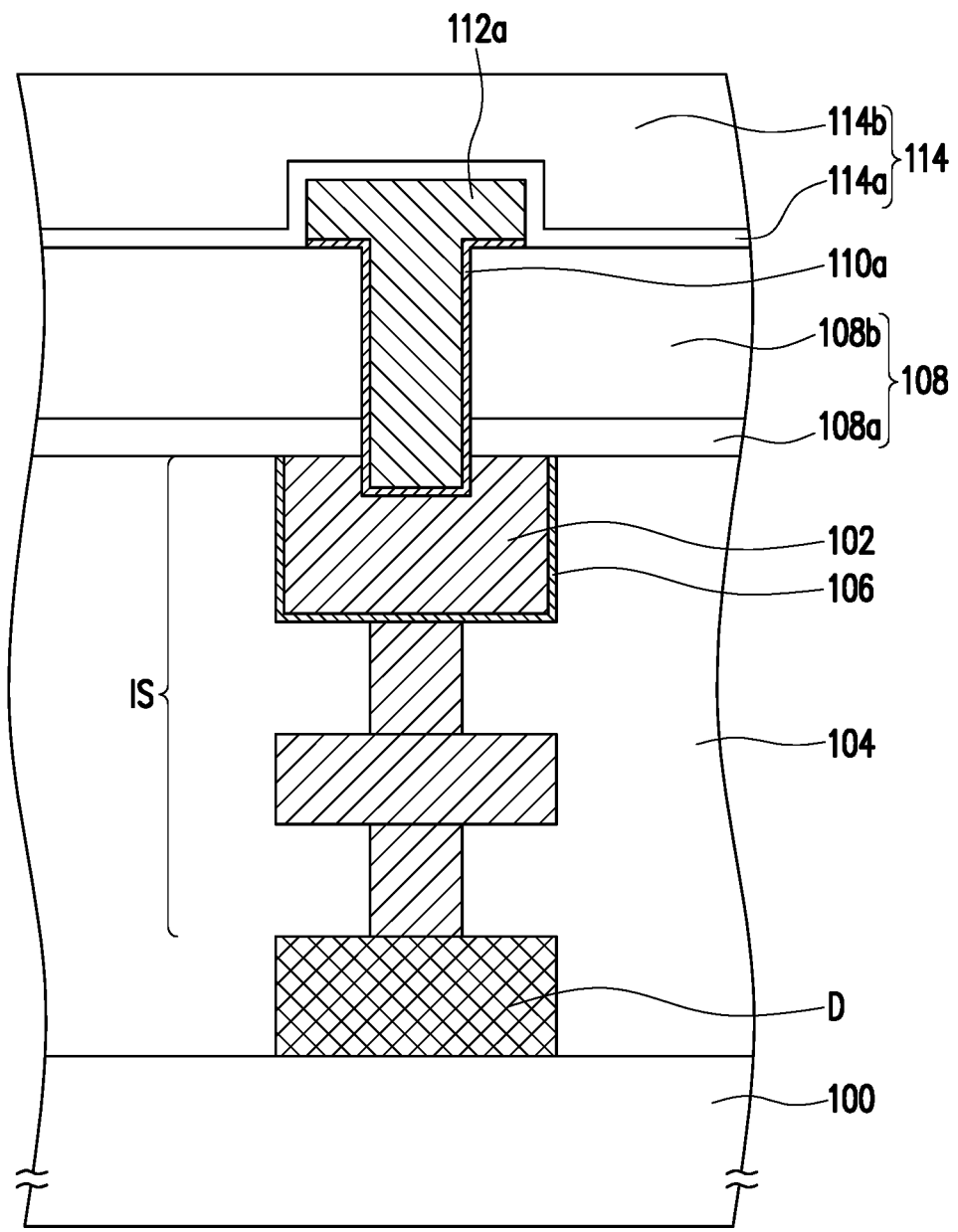

FIG. 1F is a cross-sectional view illustrating one stage of a method of fabricating a semiconductor device 10 in accordance with some embodiments of the disclosure. Referring to FIG. 1F, a dielectric layer (or referred to as a passivation layer) 114 is formed on the dielectric layer 108 and the metal pad 112a. In some embodiments, the material of the dielectric layer 114 includes silicon oxide, silicon nitride, silicon oxynitride, PSG, BPSG, SOG, FSG, carbon doped silicon oxide (e.g., SiCOH), polyimide, and/or a combination thereof. In some alternative embodiments, the material of the dielectric layer 114 includes low-k dielectric materials. Examples of low-k dielectric materials include BLACK DIAMOND®, Xerogel, Aerogel, amorphous fluorinated carbon, Parylene, BCB, Flare, SILK®, HSQ or SiOF, and/or a combination thereof. It is understood that dielectric layer 114 may include one or more dielectric materials and/or one or more dielectric layers. For example, the dielectric layer 114 includes a dielectric layer 114a and a dielectric layer 114b disposed on the dielectric layer 114a. In some embodiments, the material of the dielectric layer 114a is silicon nitride, and material of the dielectric layer 114b is silicon oxide. The dielectric layer 114 may be formed to a suitable thickness by FCVD, CVD, HDPCVD, SACVD, spin-on, sputtering, or other suitable methods.

Figure 1G:
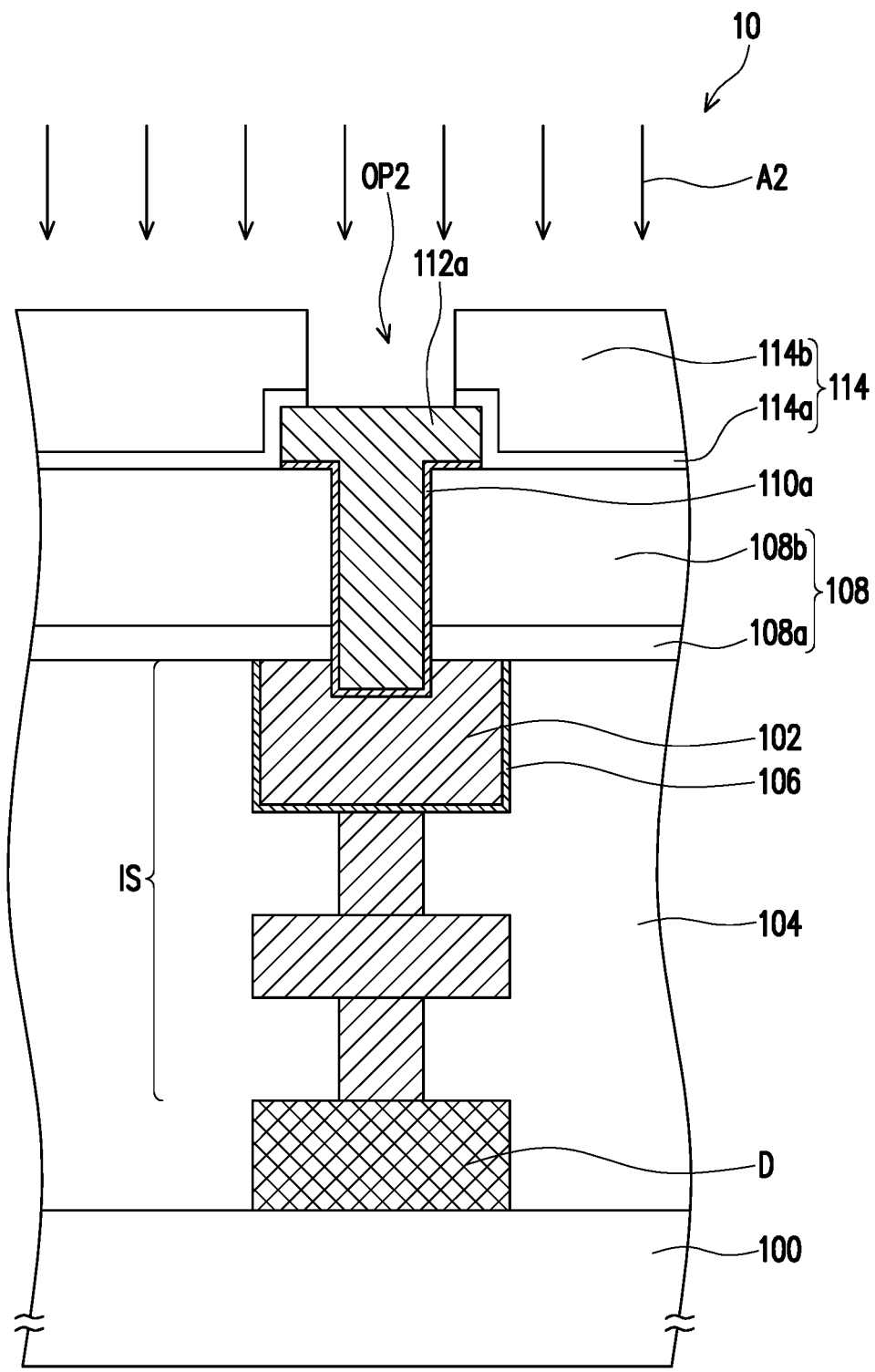

FIG. 1G is a cross-sectional view illustrating one stage of a method of fabricating a semiconductor device 10 in accordance with some embodiments of the disclosure. Referring to FIG. 1G, the dielectric layer 114 is patterned, thereby forming an opening OP2 exposing the metal pad 112a. In some embodiments, the opening OP2 exposes a portion of the top surface of the metal pad 112a. That is, the dielectric layer 114 may cover a portion of the top surface of the metal pad 112a. In some alternative embodiments, the opening OP2 exposes the entire top surface of the metal pad 112a. That is, the dielectric layer 114 may not cover the top surface of the metal pad 112a. The dielectric layer 114 may be patterned by, for example, a lithography process and an etching process. The above-mentioned etching process may be a dry etching process.

Furthermore, after patterning the dielectric layer 114, an annealing process A2 is performed to the semiconductor device 10. The annealing process A2 may be referred to as an ally process. The extra charges at the semiconductor/dielectric interface generated during the previous process may be removed by the annealing process A2, thereby reducing the device to device electrical characterization mismatch (e.g., ultra low threshold voltage PMOS (uLVTP) mismatch or standard threshold voltage PMOS (SVTP) mismatch) which is random happened in the wafer. In some embodiments, the annealing process A2 is performed in an atmosphere of a gas including 50 vol % to 100 vol % of hydrogen ($H_2$). The annealing process A2 may be performed in the atmosphere of the gas including 100 vol % of hydrogen (i.e., pure hydrogen ($H_2$)). In alternative embodiments, the gas may further include nitrogen ($N_2$), oxygen ($O_2$), an inert gas (e.g., helium (He)), or a combination thereof. The annealing process A2 may be performed at a temperature between 350° C. and 500° C. The annealing process A2 is performed for, for example, 20 minutes to 2 hours. A heating rate of the annealing process A2 ranges, for example, from 40° C./min to 60° C./min.

Figure 2:
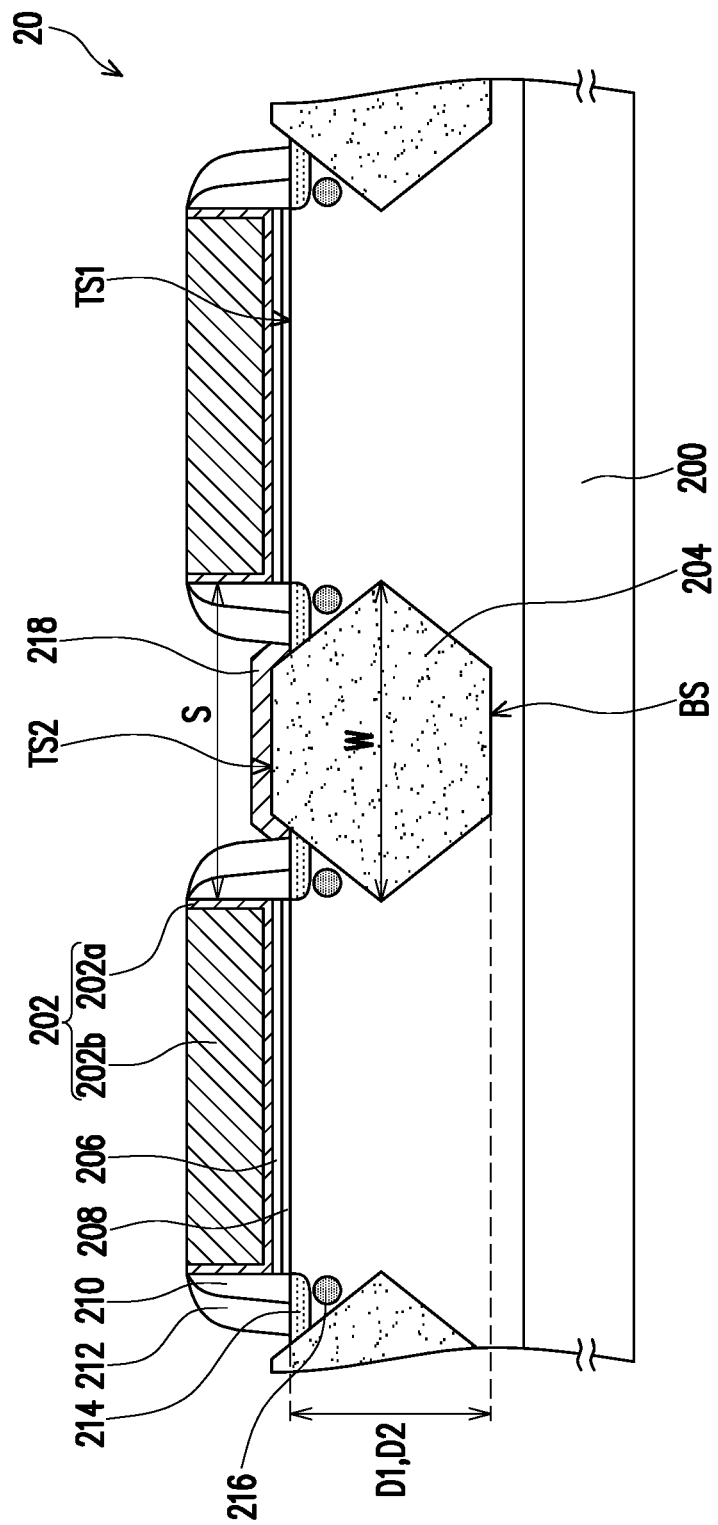
FIG. 2 is a cross-sectional view illustrating a semiconductor device in accordance with some embodiments of the disclosure.

FIG. 2 is a cross-sectional view illustrating a semiconductor device 20 in accordance with some embodiments of the disclosure. Referring to FIG. 2, a semiconductor device 20 may include a substrate 200, a plurality of gate electrodes 202, and a source/drain epitaxial layer 204. The semiconductor device 20 may be a transistor. The semiconductor device 20 may be a long gate length (Long-Lg) transistor, a middle gate length (Middle-Lg) transistor, or a short gate length (Short-Lg) transistor. The semiconductor device 20 may be a planar P-type Metal-Oxide-Semiconductor (PMOS) or a P-type FinFET. The semiconductor device 20 may be a high-k metal gate (HKMG) transistor. The substrate 200 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a BOX layer, a silicon oxide layer, or the like. The insulator layer is provided on a substrate, typically a silicon or glass substrate. Other substrates, such as a multi-layered or gradient substrate, may also be used.

In some embodiments, the substrate 200 includes a crystalline silicon substrate (e.g., wafer). In some alternative embodiments, the semiconductor substrate 200 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP.

As illustrated in FIG. 2, the gate electrodes 202 are disposed on the substrate 200. The gate electrode 202 may be a single-layered structure or a multi-layered structure. The gate electrode 202 may be a metal gate, but the disclosure is not limited thereto. In some embodiments, the gate electrode 202 is formed by a gate-last process. For example, the gate electrode 202 may be a multi-layered structure including a work function metal layer 202a and a metal layer 202b formed by the gate-last process, and the work function metal layer 202a may have a U-shape (as shown in FIG. 2), but the disclosure is not limited thereto. In some alternative embodiments, the gate electrode 202 is formed by the gate-first process, and the work function metal layer 202a may have a flat shape (not shown).

In some embodiments, the work function metal layer 202a is tuned to have the proper work function. For example, if a p-type work function metal (p-metal) for a PMOS device is desired, p-type work function materials may be used. In alternative embodiments, the material of the work function metal layer 202a includes p-type work function materials. Examples of the p-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials. The work function metal layer 202a may be formed by, for example, CVD, PVD, and/or other suitable processes.

In some embodiments, the metal layer 202b is disposed on the work function metal layer 202a. The material of the metal layer 202b may include a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The metal layer 202b may be formed by, for example, CVD, PVD, plating, and/or other suitable processes.

The source/drain epitaxial layer 204 is disposed in the substrate 200 and between two adjacent gate electrodes 202. The bottom surface BS of the source/drain epitaxial layer 204 is buried in the substrate 200 to a depth D1 less than or equal to two-thirds of a spacing S between the two adjacent gate electrodes 202. In some embodiments, the bottom surface BS of the source/drain epitaxial layer 204 is buried in the substrate 200 to the depth D1 of one-half to two-thirds of the spacing S between the two adjacent gate electrodes 202. For example, when the spacing S is 0.03 µm, the distance D1 ranges from 0.015 µm to 0.02 µm. The spacing S between the two adjacent gate electrodes 202 is referred to a minimum distance between the conductive layer of one of the two adjacent gate electrodes 202 and the conductive layer of the other of the two adjacent gate electrodes 202. In some embodiments, a distance D2 from the bottom surface BS of the source/drain epitaxial layer 204 to the top surface TS1 of the substrate 200 is less than or equal to two-thirds of the spacing S between the two adjacent gate electrodes 202. For example, the distance D2 from the bottom surface BS of the source/drain epitaxial layer 204 to the top surface TS of the substrate 200 may be in a range from one-half to two-thirds of the spacing S between the two adjacent gate electrodes 202. For example, when the spacing S is 0.03 µm, the distance D2 ranges from 0.015 µm to 0.02 µm. The device mismatch (e.g., uLVTP mismatch or SVTP mismatch) can be reduced by the setting manner of the depth D1 or the distance D2. For example, the device mismatch can be reduced by about 25% to 35%. A maximum width W of the source/drain epitaxial layer 204 may be less than twice the spacing S between the two adjacent gate electrodes 202. The top surface TS2 of the source/drain epitaxial layer 204 may be higher than the top surface TS1 of the substrate 200.

In some embodiments, the source/drain epitaxial layer 204 is a silicon-germanium (SiGe) structure, and the content of germanium (Ge) in the SiGe structure may be in a range from 30 atom % to 80 atom %. The SiGe structure may be formed of a single layer or multiple layers having different composition. The source/drain epitaxial layer 204, such as the SiGe structure, may be formed by an epitaxy or epitaxial (epi) process with p-type dopants for straining a p-type transistor. That is, the source/drain epitaxial layer 204 may be doped with the p-type dopants to be the source and the drain of the p-type transistor. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 200.

The semiconductor device 20 may further include a high-k dielectric layer 206. The high-k dielectric layer 206 may be disposed between the gate electrode 202 and the substrate 200. The material of the high-k dielectric layer 206 may include a material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanium oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). In some embodiments, the high-k dielectric layer 206 is formed by high-k first process, and the high-k dielectric layer 206 may have a flat shape (as shown in FIG. 2). In some alternative embodiments, the high-k dielectric layer 206 is formed by high-k last process, and the high-k dielectric layer 206 may have a U-shape (not shown). Whether the high-k dielectric layer 206 has the flat shape or the U-shape, the spacing S between the two adjacent gate electrodes 202 is referred to a minimum distance between the conductive layer of one of the two adjacent gate electrodes 202 and the conductive layer of the other of the two adjacent gate electrodes 202. The high-k dielectric layer 206 may be formed by, for example, CVD, ALD, PECVD, or plasma enhanced ALD (PEALD).

The semiconductor device 20 may further include an interfacial layer 208. The interfacial layer 208 may be disposed between the high-k dielectric layer 206 and the substrate 200. The material of the interfacial layer 206 may include silicon oxide. The interfacial layer 208 may be formed by, for example, chemical oxide technique, thermal oxide procedure, ALD or CVD.

The semiconductor device 20 may further include spacers 210. The spacers 210 may be disposed on the sidewalls of the gate electrode 202. The semiconductor device 20 may further include spacers 212. The spacers 212 may disposed on the spacers 210. The material of the spacers 210 and spacers 212 may include silicon oxide, silicon nitride, silicon oxynitride, and/or other applicable dielectric materials. The spacers 210 and spacers 212 may be formed by depositing one or multiple dielectric layers over substrate 200, and then performing an etching back process on the dielectric layer. That is, the spacers 210 and the spacers 212 may be formed of a single layer or multiple layers. The semiconductor device 20 may further include lightly doped drains (LDDs) 214. The LDDs 214 may be located in the substrate 200 and below the spacers 210 and the spacers 212. The semiconductor device 20 may further include pocket regions 216. The pocket regions 216 may be located in the substrate 200 and below the LDDs 214. The LDDs 214 and the pocket regions 216 may have different conductive types. For example, when the semiconductor device 20 is the PMOS transistor, the conductive type of the LDDs 214 is p-type, and the conductive type of the pocket regions 216 is n-type. The semiconductor device 20 may further include a silicide region 218. For example, when the source/drain epitaxial layer 204 is a SiGe structure, the silicide region 218 may be formed by blanket depositing a metal layer (not shown), which may include nickel, platinum, palladium, vanadium, titanium, cobalt, tantalum, titanium, ytterbium, zirconium, and combinations thereof. The substrate is then heated, which causes silicon and germanium to react with the metal layer where they are in contact. After the reaction, a layer of metal silicide and/or metal germano-silicide is formed between silicon/germanium and metal. The un-reacted metal layer is then removed.

In some embodiments, in a method of fabricating a semiconductor device, an annealing process is performed in an atmosphere of a gas including 50 vol % to 100 vol % of hydrogen to remove extra charges generated from the previous processes, thereby decreasing the device mismatch without extra mask. In alternative embodiments, a semiconductor device has a shallow source/drain epitaxial layer by setting a depth of a bottom surface of the source/drain epitaxial layer buried in a substrate, thereby decreasing the device mismatch without extra mask.

In accordance with some embodiments of the disclosure, a method of fabricating a semiconductor device includes at least the following steps. A first metal layer is formed on a substrate. A first dielectric layer is formed on the substrate. The first dielectric layer is patterned, thereby forming a first opening exposing the first metal layer. A second metal layer is formed on the first dielectric layer and filling into the first opening. The second metal layer is patterned, thereby forming a metal pad. A second dielectric layer is formed on the first dielectric layer and the metal pad. The second dielectric layer is patterned, thereby forming a second opening exposing the metal pad. A first annealing (alloy) process is performed in an atmosphere of a gas including 50 vol % to 100 vol % of hydrogen ($H_2$).

In accordance with some alternative embodiments of the disclosure, a semiconductor device includes a plurality of gate electrodes and a source/drain epitaxial layer. The gate electrodes are disposed on a substrate. The source/drain epitaxial layer is disposed in the substrate and between two adjacent gate electrodes. The bottom surface of the source/drain epitaxial layer is buried in the substrate to a depth less than or equal to two-thirds of a spacing between the two adjacent gate electrodes.

In accordance with some alternative embodiments of the disclosure, a semiconductor device includes a substrate, a plurality of gate electrodes, and a SiGe structure. The gate electrodes are disposed on the substrate. The SiGe structure is disposed in the substrate and between two adjacent gate electrodes. A distance from the bottom surface of the SiGe structure to the top surface of the substrate is in a range from one-half to two-thirds of a spacing between the two adjacent gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a first metal layer on a substrate;
   forming a first dielectric layer on the substrate;
   patterning the first dielectric layer, thereby forming a first opening exposing the first metal layer, wherein a first thickness of the first metal layer is removed, and a ratio of the first thickness of the first metal layer to an entire thickness of the first metal layer ranges from 1/5 to 1/3;
   forming a second metal layer on the first dielectric layer and filling into the first opening;
   patterning the second metal layer, thereby forming a metal pad;
   forming a second dielectric layer on the first dielectric layer and the metal pad;
   patterning the second dielectric layer, thereby forming a second opening exposing the metal pad; and
   performing a first annealing process in an atmosphere of a gas comprising 50 vol % to 100 vol % of hydrogen ($H_2$).

2. The method of fabricating the semiconductor device according to claim 1, wherein the first annealing process is performed after the patterning the second dielectric layer.

3. The method of fabricating the semiconductor device according to claim 1, wherein first annealing process is performed in the atmosphere of the gas comprising 100 vol % of hydrogen ($H_2$).

4. The method of fabricating the semiconductor device according to claim 1, wherein the gas further comprises nitrogen ($N_2$), oxygen ($O_2$), an inert gas, or a combination thereof.

5. The method of fabricating the semiconductor device according to claim 1, wherein the first annealing process is performed at a temperature between 350° C. and 500° C.

6. The method of fabricating the semiconductor device according to claim 1, wherein the first annealing process is performed for 20 minutes to 2 hours.

7. The method of fabricating the semiconductor device according to claim 1, wherein a heating rate of the first annealing process ranges from 40° C./min to 60° C./min.

8. The method of fabricating the semiconductor device according to claim 1, wherein the forming the first opening comprises:
   performing a main etching process; and
   performing an over-etching process after performing the main etching process.

9. The method of fabricating the semiconductor device according to claim 8, wherein a radio frequency (RF) power of the over-etching process is less than 3 times a RF power of the main etching process.

10. The method of fabricating the semiconductor device according to claim 8, wherein a RF power of the over-etching process is 2 to 3 times a RF power of the main etching process.

11. The method of fabricating the semiconductor device according to claim 1, further comprising:
    performing a second annealing process after forming the first opening.

12. The method of fabricating the semiconductor device according to claim 11, wherein the second annealing process is performed at a temperature between 400° C. and 800° C., and the second annealing process is performed for 30 minutes to 4 hours.

13. The method of fabricating the semiconductor device according to claim 1, wherein the first metal layer is a top metal layer.

14. A method of fabricating a semiconductor device, comprising:
    forming a first dielectric layer on a first conductive layer;
    forming a first opening in the first dielectric layer and the first conductive layer comprising:
       performing a main etching process on the first dielectric layer; and
       performing an over-etching process to remove a first thickness of the first conductive layer, wherein a ratio of the first thickness of the first conductive layer to an entire thickness of the first conductive layer is greater than 1/5;
    forming a second conductive layer on the first dielectric layer and filling into the first opening;
    patterning the second conductive layer, thereby forming a conductive pattern on the first dielectric layer and in the first opening,
    performing a first annealing process on the first dielectric layer and the first conductive layer having the first opening;
    forming a second dielectric layer over the first dielectric layer and the conductive pattern;
    forming a second opening in the second dielectric layer, wherein the second opening exposes the conductive pattern; and
    performing a second annealing process on the conductive pattern and the second dielectric layer having the second opening,
    wherein the first annealing process and the second annealing process are performed in different atmospheres.

15. The method of fabricating the semiconductor device according to claim 14, wherein a radio frequency (RF) power of the over-etching process is greater than a RF power of the main etching process.

16. The method of fabricating the semiconductor device according to claim 14, wherein the first annealing process is performed in an oxygen-containing atmosphere, and the second annealing process is performed in a hydrogen-containing atmosphere.

17. The method of fabricating the semiconductor device according to claim 16, the oxygen-containing atmosphere comprises a $H_3PO_4/HNO_3$ mixture, and the hydrogen-containing atmosphere comprises hydrogen ($H_2$).

18. The method of fabricating the semiconductor device according to claim 14, further comprising:

forming a third dielectric layer between the first dielectric layer and the first conductive layer, wherein the main etching process is performed by using the third dielectric layer as an etching stop layer.

19. A method of fabricating a semiconductor device, comprising:
   forming a first passivation layer on a top metal layer of an interconnect structure;
   patterning the first passivation layer comprising:
      performing a main etching process to form the first opening in the first passivation layer; and
      performing an over-etching process to form a recess in the top metal layer;
   performing a first annealing process on the first passivation layer having the first opening and the top metal layer having the recess;
   forming a barrier layer on a top surface of the first passivation layer and filling into the first opening in the first passivation layer and the recess in the top metal layer;
   forming a conductive layer on the barrier layer in the first opening and the recess;
   patterning the conductive layer, thereby forming a conductive pad on a first portion of the top surface of the first passivation layer and in the first opening and the recess, wherein a second portion of the top surface of the first passivation layer is exposed;
   forming a second passivation layer over the first passivation layer and the conductive pad; and
   patterning the second passivation layer to form a second opening, wherein the second opening exposes the conductive pad; and
   performing a second annealing process on the conductive pad and the second passivation layer having the second opening,
   wherein the first annealing process and the second annealing process are performed in different atmospheres.

20. The method of fabricating the semiconductor device according to claim 19, wherein the first annealing process is performed in an oxygen-containing atmosphere, and the second annealing process is performed in a hydrogen-containing atmosphere.

\* \* \* \* \*